Nov. 22, 1960 R. C. MANRING 2,961,609

PULSE WIDTH DISCRIMINATOR CIRCUIT

Filed Nov. 5, 1956

INVENTOR.
ROBERT C. MANRING

BY

Mueller and Aichele

ATTYS.

2,961,609

PULSE WIDTH DISCRIMINATOR CIRCUIT

Robert C. Manring, Phoenix, Ariz., assignor to Motorola, Inc., Chicago, Ill., a corporation of Illinois Filed Nov. 5, 1956, Ser. No. 620,431

3 Claims. (Cl. 328—112)

This invention relates to pulse width discriminator circuits, and more particularly to pulse width discriminator circuits which will pass electrical pulses between predetermined maximum and minimum widths.

One object of the invention is to provide new and improved pulse width discriminator circuits.

Another object of the invention is to provide pulse width discriminator circuits which are simple and reliable in construction and operation.

A further object of the invention is to provide pulse width discriminator circuits which include a minimum number of elements.

One feature of the invention is the provision of pulse width discriminator circuits utilizing a single delay line.

Another feature of the invention is the provision of pulse width discriminator circuits in which a pulse is transmitted along a delay line having a shorted end so that the pulse is inverted and reflected back along the line and the line is tapped at an intermediate point thereon so that the delay from this point to the shorted end of the line and time of the reflected pulse back controls the width of the original pulse appearing at the tapped point.

Another feature of the invention is the provision of a pulse width discriminator circuit in which a pulse is fed along parallel paths to a mixer tube and to a delay line, and the delay line is tapped at a point a predetermined distance or time delay from the far end thereof to provide a gating signal to the mixer tube, and the far end of the delay line is short circuited so that as the leading edge of the pulse arrives at the far end of the delay line a pulse inverted with respect to the original pulse is reflected back along the delay line and stops the gating pulse as the reflected pulse arrives at the tap on the delay line.

Referring now to the drawings.

Figures 1, 2, 3:
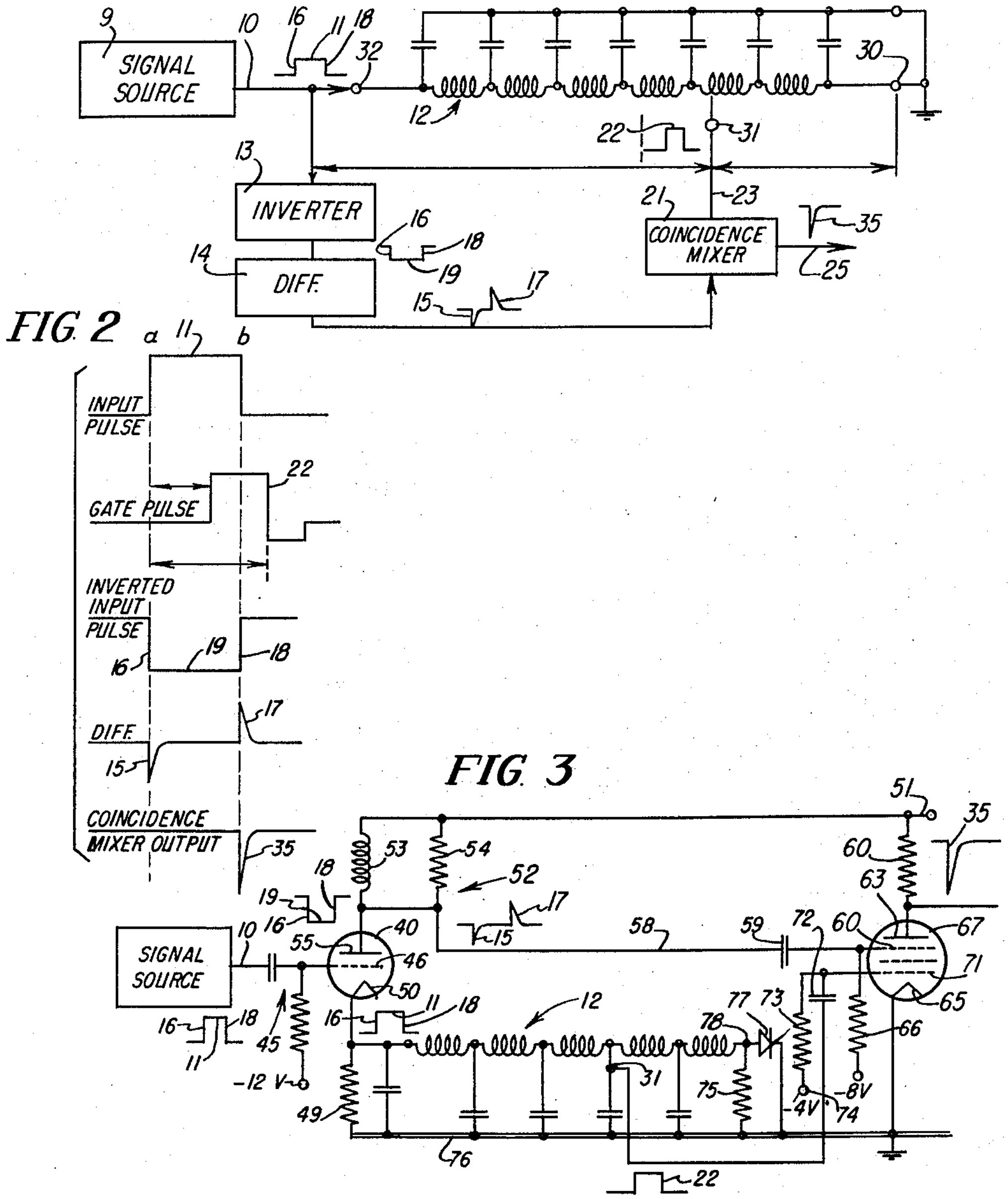
Fig. 1 is a block diagram illustrating a circuit forming one embodiment of the invention.
Fig. 2 is a group of graphs illustrating the operation of the circuit shown in Fig. 1.
Fig. 3 is a diagrammatic view of the circuit shown in Fig. 1.

The present invention provides a circuit in which pulses are fed from a signal source along one path to a mixer tube and along the second path made up by a delay line having a predetermined length and hence a predetermined time delay for a pulse moving therealong. The delay line has an entrance end and an exit end. The exit end is short circuited so that, as a leading edge of each pulse reaches the exit end it is inverted and reflected back along the delay line at the same rate of speed at which the original pulse moves forward along the delay line. The delay line is tapped at a predetermined distance or delay time from the exit end thereof which distance is chosen to provide one-half the allowable error in width of the original pulses. The length of the delay line is equal in time delay to the desired length of the original pulse, which is to be passed or gated through the mixing tube. As the leading edge of each original pulse travels down the delay line it is delayed linearly to the length to the portion of the length of the delay line along which it travels. By the time the pulse has reached the tapped point in the delay line it will be delayed a time equal to the minimum desired width of a pulse to be passed or gated by the mixing tube. The gating pulse is transmitted from the tapped point to the mixer tube to make it conductive. The gating pulse continues for a period of time in which the leading edge travels on to the exit end of the delay line, is inverted and reflected back to the tapped point, at which time the inverted pulse cancels the remainder of the original pulse of the mixing tube. The width of the gating pulse is the time required for the leading edge of the original pulse to travel from the tapped point along the delay line to the exit end thereof and back from the exit end to the tapped point on the delay line, and this period of gating time is fixed by the distance or time delay between the tapped point on the delay line and the exit end thereof regardless of the variations in length of pulses transmitted to the delay line and the mixing tube. The original pulse fed directly toward the mixer is then differentiated and the spike coincidental with the trailing edge thereof arrives undelayed to the mixer. The mixer is so biased that at the time the trailing edge reaches the mixer, the mixer is not actuated unless the gating pulse concurrently actuates the mixer. Since the delay line is of a length equal to the desired width of pulses to be passed and the delay line is tapped at a point from the exit end a time or distance equal to the allowable limit of the pulse width, the gating pulse precisely discriminates against pulses of widths outside such allowable limits.

Referring now in detail to the drawings, there is shown in Fig. 1 an input line 10 from a pulse source 9 feeding spaced recurring pulses 11 along one path to a linear delay line 12 and along a second parallel to an inverter 13 and a differentiator 14, which forms a sharp negative leading pulse or spike 15 coincident with a leading edge 16 of the inverted pulse 19 and a sharp positive pulse or spike 17 coincident with a trailing edge 18 of the inverted pulse 19. The pulse 15 and 17 are fed to a coincidence mixer 21, and if the pulse 17 arrives at the mixer 21 while a gating pulse 22 is transmitted through a lead 23 to the mixer 21, a pulse 35 coincident with the pulse 17 is transmitted by the mixer 21 to an output lead 25 thereof.

As the leading edge 16 of the positive pulse 11 is fed along the delay line 12, it is delayed by the inductance and capacitance thereof at a predetermined rate. The length of the delay line 12 is equal to the desired or nominal width of the pulses 11, and, at a distance from an exit end 30 of the delay line 12, which is grounded, a tap 31 is provided to cause a delay of a pulse travelling along in the delay line from the tap 31 to the end 30 of one half the range within which the pulses 11 are permitted to vary from the desired or nominal width. That is, the width of the pulses 11 may be within a range of from a minimum determined by delay or time of passage from the entrance end 32 of the delay line to the tap 31 to a maximum equal to the minimum plus twice the delay or length of the portion of the delay line from the tap 31 to the exit end 30.

As the leading edge 16 reaches the tap 31 it starts to gate the coincidence mixer 21 to permit any positive pulse from the differentiator 14 to be transmitted through the mixer 21. The mixer 21 is kept in "passing" or conductive state, as the leading edge 16 of the pulse 11 travels from the tap 31 to the exit end 30 of the delay line and back to the tap 31. Since the exit end 30 of the delay line is grounded, the pulse 11 is inverted and is reflected back along the delay line 12 from the exit end 30 toward the entrance end 32, and, as it travels back it cancels the portions of the positive pulse it meets along the delay line 12. This action is illustrated by the curves of Fig. 2. Thus, as the leading edge 16 of the pulse is reflected back in inverted form, it is delayed by one half the allowable limit in travelling from the end 30 to the tapped point 31. And as the inverted pulse reaches the tap 31 it cancels the remaining portion of the pulse 11 which has not yet traveled from the entrance end 32 to the tap 31. This terminates the pulse 22 to make the mixer 21 non-conductive for positive pulses fed thereto from the differentiator 14. Hence, the trailing edge 18 of the pulse 11 must occur within the occurrence of the gating pulse 22 which is of a predetermined width or duration and starts and ends precise times later than the occurrence of the leading edge 16 of the pulse 11. The mixer 21 upon simultaneous actuation by the gating pulse 22 and the differentiated positive pulse 17 forms an output pulse 35.

The circuit shown in Fig. 3 includes a cathode follower pulse-driver-and-inverter tube 40. The signal pulses 11 are fed from a line 10 leading from a source of the signals 11 to the tube 40. A bias network 45 is provided between a grid 46 of the tube 40 and the line 10, and the tube 40 inverts each pulse 11 and the inverted pulse 19 appears at the plate 55. The pulse 11 without inversion is fed to the inductor-capacitor delay line 12 across a resistor 49 connected to cathode 50 of the tube 40 to form a cathode follower circuit with the tube 40.

B-plus voltage of 150 volts D.C., for example, is fed from a conductor 51 through a parallel resistance inductanec circuit 52 formed by an inductor 53 and a resistor 54 to a plate 55 of the tube 40. The network 52 is a differentiating network and forms a negative pulse 15 coincident with the leading edge 16 of each pulse 19 and a positive pulse 17 coincident with each trailing edge 18 of the pulses 19. The pulses 15 and 17 are transmitted along a line 58 to a D.C. blocking capacitor 59 to one control grid 60 of the mixing tube of a pulse coincident mixer tube 61. B-plus voltage is supplied to the tube 61 through a resistor 62 to a plate 63 of the tube 61 and a cathode 65 of the tube 61 is grounded. A resistor 66 is connected to minus 8 volts D.C. to provide grid-cathode bias between the grid 60 and the cathode 65.

A second control grid 71 also is provided and receives signals through a capacitor 72. Bias between the grid 71 and the cathode 65 is provided by a resistor 73 connected to a terminal 74 having a suitable negative voltage supplied thereto, in one successful example negative four volts D.C. being supplied. The delay line 12 has an exit terminal 78 connected by a resistor 75 to a grounded bus 76, and is connected by a diode 77 directly to the grounded bus 76. The diode switch 77 and the resistor 75 act as a clamp so that spurious energy circulating in the delay line due to the ringing and secondary reflections are rapidly absorbed and the pulse width discriminator is effective in operation on closely spaced pulses.

The above-described circuits are very effective in precisely discriminating against pulses having a width greater or less than a predetermined allowable range of width, and provide very effective pulse width discrimination with a minimum of components and cost. Furthermore, the maintenance of the pulse width discriminator is negligible and its life is indefinite without change in characteristics.

I claim:

1. A pulse width discriminator including in combination, pulse signal input means, coincidence mixer means, a delay line having a signal-receiving end, a remote end and a tap intermediate said ends, said delay line having a delay length equal to the nominal width of pulses to be applied thereto and said tap being spaced from the remote end thereof to provide a delay therebetween equal to the allowable deviation of the pulse width from the nominal width thereof, means connecting said pulse input means to said signal receiving end of said delay line for applying signal pulses thereto, means connecting said tap on said delay line to said mixer means, circuit means for inverting and differentiating the signal pulses, and means connecting said circuit means between said pulse input means and said mixer means for applying differentiated pulses to said mixer means, said delay line including means for reflecting the pulse from said remote end of said delay line back to said tap in inverted form to cancel subsequent portions of the pulse arriving at said tap, whereby said delay line provides at said tap thereon in response to each signal pulse a gating pulse of a duration equal to the time required for a signal to travel from said tap to said far end of said delay line and back to said tap and such gating pulse is transmitted to said mixer means, said mixer means passing the differentiated pulses which are applied to said mixer means in coincidence with the gating pulses applied thereto.

2. A pulse width discriminator including in combination, a mixing device having a first control element and a second control element requiring positive pulses thereon simultaneously in order to form an output pulse, a cathode-follower pulse-driver-inverter circuit having an input for receiving pulses and first and second outputs providing signal pulses of opposite polarity, a differentiating circuit, means connecting said differentiating circuit to said first output, whereby said differentiating circuit produces pulses of positive polarity coincident in time to the trailing ends of the signal pulses, means connecting one control element of the mixing device to said differentiating circuit for feeding said positive differentiated pulses to said one control element, a delay line of predetermined length equal in delay time to the nominal width of the signal pulses and having a starting end, a remote end and a tap intermediate said ends, a diode connected to and short-circuiting the remote end of said delay line, said intermediate tap and said remote end being spaced along said delay line by a predetermined delay length equal to the allowable deviation of the pulse width from the nominal width thereof, means connecting said second output of said inverter circuit to said starting end of said delay line for applying signal pulses thereto, and means connecting said tap on said delay line to said second control element of said mixing device for applying positive gating pulses thereto, said delay line providing a gating pulse at said tap thereon starting when the leading edge of the signal pulse reaches said tap and continuing during the time such leading edge travels to the remote end of said delay line and is reflected back therefrom to said tap, so that output pulses are produced by said mixing means when the trailing ends of the signal pulses fall within the allowable deviation from the nominal pulse width.

3. A pulse width discriminator including in combination, pulse signal input means, coincidence mixer means, differentiating means providing pulses corresponding in time to the leading and trailing edges of pulses applied thereto, means connecting said differentiating means between said signal input means and said mixer means, a delay line having an entrance end, a remote end, and a tap intermediate said entrance and remote ends, means connected to and short-circuiting said remote end of said delay line for inverting and reflecting pulses back along the delay line, means coupling said entrance end of said delay line to said signal input means, and means coupling said mixer means to said tap on said delay line, said delay line providing at said tap thereon in response to signal pulses a gating pulse when the leading edge of the signal pulse applied to said delay line reaches said tap, with such gating pulse continuing during the time the signal pulse travels to said remote end and is reflected back therefrom to said tap, said mixer means responding to said gating pulse to produce a pulse output in response to coincidence of said pulse from said differentiating means at the trailing edge of the applied pulse and said gating pulse from said delay line.

References Cited in the file of this patent

UNITED STATES PATENTS 2,266,154 Blumblein ............ Dec. 16, 1941
2,437,313 Bedford ............ Mar. 9, 1948
2,444,438 Greig ............ July 6, 1948
2,484,352 Miller et al. ............ Oct. 11, 1949
2,531,164 Sands et al. ............ Nov. 21, 1950
2,612,620 Winter ............ Sept. 30, 1952
2,648,766 Eberhard ............ Aug. 11, 1953
2,703,364 Birnbaum ............ Mar. 1, 1955
2,729,793 Anderson ............ Jan. 3, 1956
2,795,775 Faymoreau et al. ............ June 11, 1957